(12) United States Patent
Disney et al.

(10) Patent No.: US 8,841,708 B2
(45) Date of Patent: Sep. 23, 2014

(54) METHOD AND SYSTEM FOR A GAN VERTICAL JFET WITH SELF-ALIGNED SOURCE METALLIZATION

(75) Inventors: Donald R. Disney, Cupertino, CA (US); Richard J. Brown, Los Gatos, CA (US); Hui Nie, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 13/468,332

(22) Filed: May 10, 2012

(65) Prior Publication Data

US 2013/0299882 A1 Nov. 14, 2013

(51) Int. Cl.
*H01L 29/808* (2006.01)

(52) U.S. Cl.
USPC .................................. 257/263; 257/E29.313

(58) Field of Classification Search
USPC .................... 257/263, 76, E21.447, E29.313, 257/E29.089, E21.108; 438/192
See application file for complete search history.

(56) References Cited

U.S. PATENT DOCUMENTS

| 7,544,552 B2 | 6/2009 | Nonaka et al. |
| 2005/0067630 A1 | 3/2005 | Zhao |
| 2006/0199312 A1 | 9/2006 | Harris et al. |
| 2007/0298559 A1 | 12/2007 | Brar et al. |
| 2012/0161208 A1 | 6/2012 | Veliadis |
| 2013/0032811 A1 | 2/2013 | Kizilyalli et al. |
| 2013/0032812 A1 | 2/2013 | Kizilyalli et al. |
| 2013/0112985 A1* | 5/2013 | Kizilyalli et al. ............... 257/76 |
| 2013/0146886 A1 | 6/2013 | Disney et al. |
| 2013/0161705 A1* | 6/2013 | Disney et al. ................. 257/263 |

OTHER PUBLICATIONS

Tanabe et al., "*High-Quality GaN Epitaxial Layers on GaN Substrates for Power Devices*", SEI Technical Review, No. 64, Apr. 2007, 6 pages.
Kwok, "*Complete Guide to Semiconductor Devices Second Edition*", IEEE Press, John Wiley & Sons, Inc., 2002, 3 pages.
Non-Final Office Action for U.S. Appl. No. 13/468,325 mailed on Aug. 27, 2013, 13 pages.
U.S. Appl. No. 13/468,325, filed May 10, 2012, by Disney et al. (Unpublished.).
Notice of Allowance for U.S. Appl. No. 13/468,325 mailed on Dec. 24, 2013, 9 pages.

\* cited by examiner

*Primary Examiner* — Telly Green
*Assistant Examiner* — Paul Patton
(74) *Attorney, Agent, or Firm* — Kilpatrick Townsend & Stockton LLP

(57) ABSTRACT

A semiconductor device includes a III-nitride substrate and a channel structure coupled to the III-nitride substrate. The channel structure comprises a first III-nitride epitaxial material and is characterized by one or more channel sidewalls. The semiconductor device also includes a source region coupled to the channel structure. The source region comprises a second III-nitride epitaxial material. The semiconductor device further includes a III-nitride gate structure coupled to the one or more channel sidewalls, a gate metal structure in electrical contact with the III-nitride gate structure, and a dielectric layer overlying at least a portion of the gate metal structure. A top surface of the dielectric layer is substantially co-planar with a top surface of the source region.

7 Claims, 19 Drawing Sheets

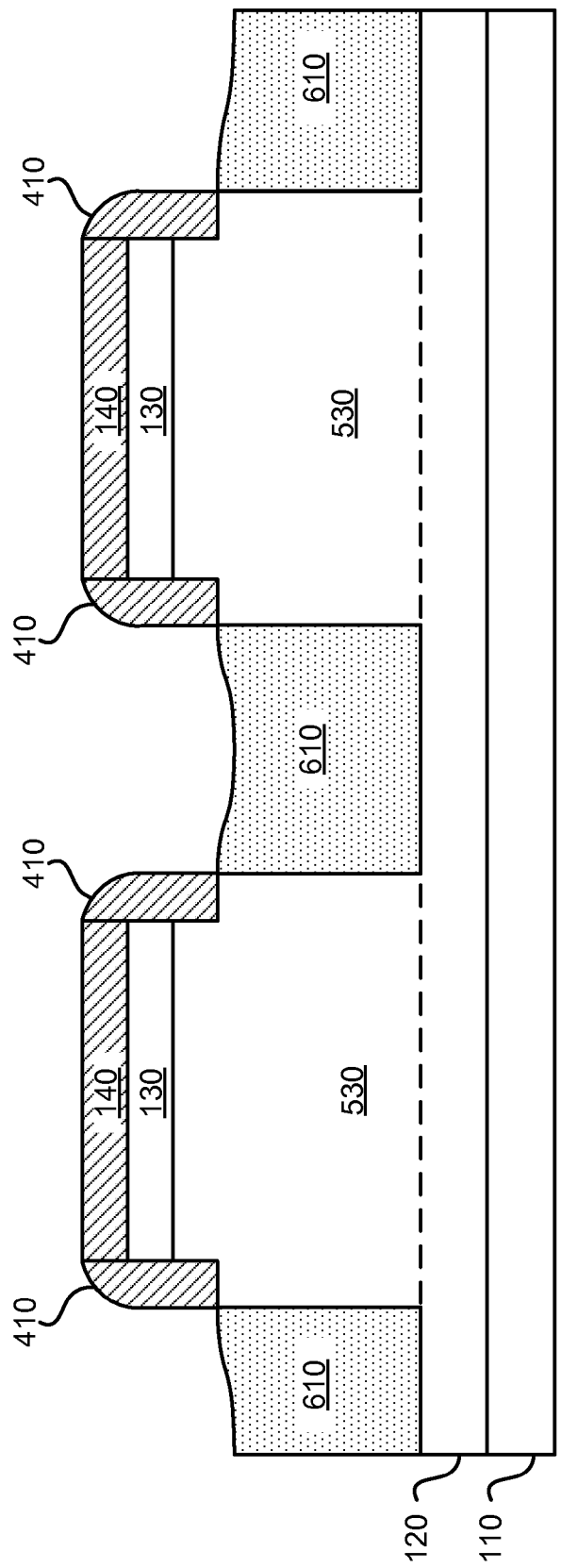

METHOD AND SYSTEM FOR A GAN VERTICAL JFET WITH SELF-ALIGNED SOURCE METALLIZATION

CROSS-REFERENCES TO RELATED APPLICATIONS

The following regular U.S. patent applications (including this one) are being filed concurrently and the entire disclosure of the other application is incorporated by reference into this application for all purposes:

application Ser. No. 13/468,325, filed May 10, 2012, entitled "METHOD AND SYSTEM FOR A GAN VERTICAL JFET WITH SELF-ALIGNED GATE METALLIZATION"; and application Ser. No. 13/468,332, filed May 10, 2012, entitled "METHOD AND SYSTEM FOR A GAN VERTICAL JFET WITH SELF-ALIGNED SOURCE METALLIZATION".

The following regular U.S. patent applications are incorporated by reference into this application for all purposes:

application Ser. No. 13/198,655, filed Aug. 4, 2011, entitled "METHOD AND SYSTEM FOR GAN VERTICAL JFET UTILIZING A REGROWN GATE,"

application Ser. No. 13/198,659, filed Aug. 4, 2011, entitled "METHOD AND SYSTEM FOR A GAN VERTICAL JFET UTILIZING A REGROWN CHANNEL,"

application Ser. No. 13/315,720, filed Dec. 9, 2011, entitled "VERTICAL GAN JFET WITH GATE SOURCE ELECTRODES ON REGROWN GATE," and application Ser. No. 13/334,514, filed Dec. 22, 2011, entitled "METHOD AND SYSTEM FOR A GAN VERTICAL JFET WITH SELF-ALIGNED SOURCE AND GATE."

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming a vertical junction field-effect transistor (JFET) using self-aligned techniques. Merely by way of example, the invention has been applied to methods and systems for manufacturing vertical JFETs using gallium-nitride (GaN) based epitaxial layers. The methods and techniques can be applied to a variety of compound semiconductor systems including n-channel and p-channel vertical JFETs, which can provide either normally-off or normally-on functionality.

According to an embodiment of the present invention, a semiconductor device is provided. The semiconductor device includes a III-nitride substrate and a first III-nitride epitaxial layer coupled to the III-nitride substrate and comprising a drift region, a channel region, and an extension region. The channel region is separated from the III-nitride substrate by the drift region. The channel region is characterized by a first width. The extension region is separated from the drift region by the channel region. The extension region is characterized by a second width less than the first width. The semiconductor device also includes a second III-nitride epitaxial layer coupled to a top surface of the extension region, a III-nitride gate structure coupled to a sidewall of the channel region and laterally self-aligned with respect to the extension region, and a gate metal structure in electrical contact with the III-nitride gate structure and laterally self-aligned with respect to the extension region.

According to another embodiment of the present invention, a method for fabricating a vertical JFET is provided. The method includes providing a III-nitride substrate of a first conductivity type and forming a first III-nitride epitaxial layer of the first conductivity type coupled to the III-nitride substrate. The method also includes forming a second III-nitride epitaxial layer of the first conductivity type coupled to the first III-nitride epitaxial layer, removing at least a portion of the second III-nitride epitaxial layer to expose a sidewall of the second III-nitride epitaxial layer, and removing at least a portion of the first III-nitride epitaxial layer to form a channel region of the vertical JFET. The channel region has a channel sidewall. The method further includes forming a III-nitride gate structure of a second conductivity type coupled to the channel sidewall. A top of the III-nitride gate structure is lower than a top of the second III-nitride epitaxial layer.

According to a specific embodiment of the present invention, a semiconductor device is provided. The semiconductor device includes a III-nitride substrate and a channel structure coupled to the III-nitride substrate. The channel structure comprises a first III-nitride epitaxial material and is characterized by one or more channel sidewalls. The semiconductor device also includes a source region coupled to the channel structure. The source region comprises a second III-nitride epitaxial material. The semiconductor device further includes a III-nitride gate structure coupled to the one or more channel sidewalls, a gate metal structure in electrical contact with the III-nitride gate structure, and a dielectric layer overlying at least a portion of the gate metal structure. A top surface of the dielectric layer is substantially co-planar with a top surface of the source region.

According to another specific embodiment of the present invention, a method for fabricating a vertical JFET is provided. The method includes providing a III-nitride substrate and forming a first III-nitride epitaxial layer having a first bottom surface coupled to the III-nitride substrate and a first top surface substantially opposite the first bottom surface. The method also includes forming a second III-nitride epitaxial layer having a second bottom surface coupled to the first top surface and a second top surface substantially opposite the second bottom surface and removing at least a portion of the second III-nitride epitaxial layer and the first III-nitride epitaxial layer to form a trench having a first sidewall. The method further includes forming a source spacer coupled to the first sidewall, removing at least an additional portion of the first III-nitride epitaxial layer to extend the trench and form a second sidewall, forming a III-nitride gate structure coupled to at least a portion of the second sidewall and separated from the second III-nitride epitaxial layer by the source spacer, and forming a dielectric layer in the trench, the dielectric layer covering at least a portion of the III-nitride gate structure and having a top surface that is substantially co-planar with a top of the second III-nitride epitaxial layer.

According to another embodiment of the present invention, a semiconductor device is provided. The semiconductor device includes a III-nitride substrate and a first III-nitride epitaxial layer coupled to the III-nitride substrate and having an extension region extending in a vertical direction. The semiconductor device also includes a second III-nitride epitaxial layer coupled to a top surface of the extension region and a III-nitride gate structure coupled to a sidewall of the extension region and laterally self-aligned with respect to the extension region. The semiconductor device further includes a gate metal structure in electrical contact with the III-nitride gate structure and laterally self-aligned with respect to the extension region and a dielectric layer overlying at least a portion of the gate metal structure, wherein a top surface of the dielectric layer is substantially co-planar with the top surface of the extension region.

Numerous benefits are achieved by way of the present invention over conventional techniques. For example, embodiments of the present invention enable the manufacture of vertical JFETs using self-aligned techniques that can reduce the amount of photolithography and removal (e.g., etching) steps, in addition to helping ensure accurate placement of the source and gate. Additionally, embodiments of the present invention utilize self-aligned gate contacts, self-aligned source contacts, or both to reduce device dimensions and increase device density. These and other embodiments of the invention, along with many of its advantages and features, are described in more detail in conjunction with the text below and attached figures.

BRIEF DESCRIPTION OF THE DRAWINGS

FIGS. 1-5 and 6A-6C are simplified cross-sectional diagrams illustrating the fabrication of a vertical junction field-effect transistor (JFET) according to an embodiment of the present invention;

Figure 1:
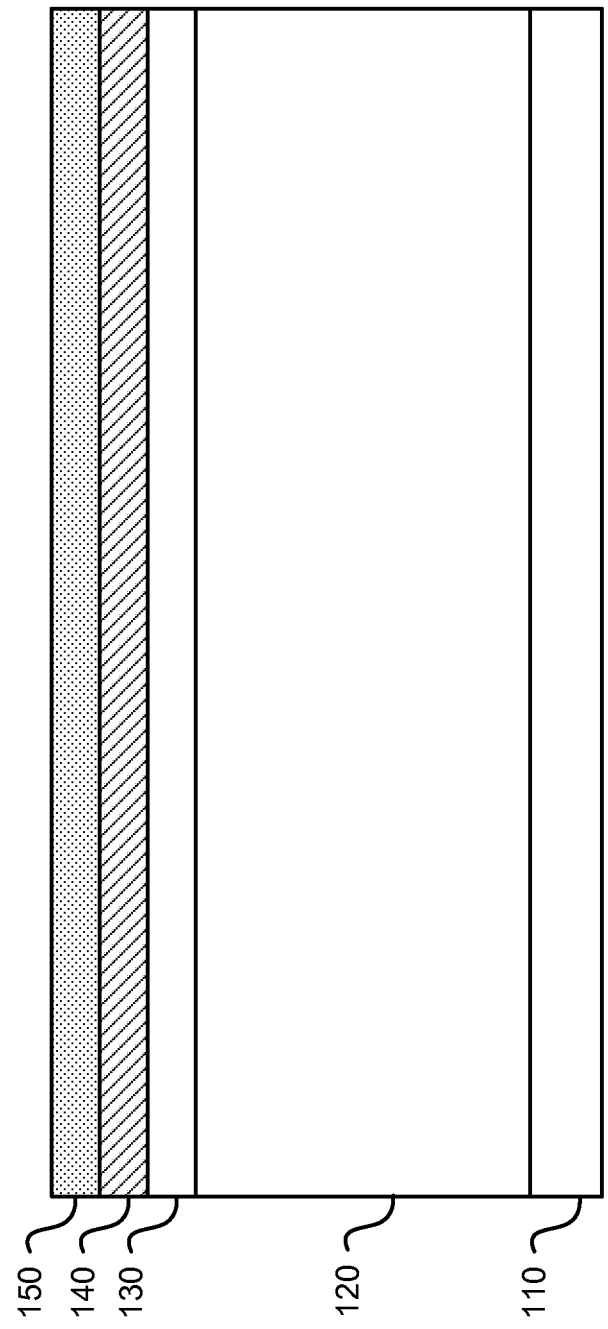

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

Embodiments of the present invention relate to electronic devices. More specifically, the present invention relates to forming a vertical junction field-effect transistor (JFET) using self-aligned techniques. Merely by way of example, the invention has been applied to methods and systems for manufacturing vertical JFETs using gallium-nitride (GaN) based epitaxial layers. The methods and techniques can be applied to a variety of compound semiconductor systems including n-channel and p-channel vertical JFETs, which can provide either normally-off or normally-on functionality.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudo-bulk GaN substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on bulk GaN substrates, on the other hand, are utilized in the embodiments described herein to provide superior properties to conventional techniques and devices. For instance, electron mobility, µ, is higher for a given background doping level, N. This provides low resistivity, ρ, because resistivity is inversely proportional to electron mobility, as provided by equation (1):

$$\rho = \frac{1}{q\mu N}, \quad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \quad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

Among the vertical device structures contemplated is a vertical JFET. Depending on doping levels, physical dimensions, conductivity type (e.g., n-type or p-type materials), and other factors, vertical JFETs can be designed to have normally-off or normally-on functionality. A normally-off vertical JFET is particularly useful due to its ability to prevent current flow if no voltage is applied to the gate, which can serve as, among other things, a safety feature for vertical JFETs used in power applications.

A normally-off vertical JFET can be created in various ways. For example, an n-type current path from source to drain can be gated on either side by p+ gates. With sufficiently low background doping, and high positive charge due to high hole concentration in the p+ gates, the channel can be depleted of carriers, or pinched off at zero bias. When a positive voltage is applied to the gate(s), the channel can be re-opened to turn the device on. Thus, in embodiments of the present invention, the vertical JFET is referred to as a vertical junction field effect transistor since the current flows vertically between the source and drain through the gated region.

Whether the vertical JFET is normally-on or normally off can depend on different features of the vertical JFET, such as the width of the channel structure, dopant concentrations in the channel structure and the gate, and the like. For example, a normally-on vertical JFET can be formed if the channel structure is sufficiently wide and/or the dopant concentrations are high enough, in which case the depletion regions may not pinch off the current when voltage $V_G$ applied to the gate is 0 V. The normally-on vertical JFET can be turned off when $V_G$ reaches a negative threshold voltage. Alternatively, for a normally-off vertical JFET, the channel is pinched off when $V_G$ is 0 V, and the normally-off vertical JFET can be turned on when $V_G$ reaches a positive threshold voltage. The manufacturing techniques described herein can apply to both normally-on and normally-off vertical JFETs.

In addition to the ability to support high-voltage, low-resistance JFET applications, the GaN vertical JFETs described herein can differ from traditional vertical JFETs in other ways. For example, other semiconductors used to manufacture vertical JFETs, such as SiC can be utilized, altering the mode of manufacture. Furthermore, the use of GaN epitaxial layers can allow for non-uniform dopant concentrations as a function of thickness within the various layers of the vertical JFET, which can optimize the performance of the device.

The manufacture of vertical JFETs can be carried out in a variety of ways. Traditional techniques can involve numerous photolithographic and etching steps, which, among other things can lengthen the time of manufacture. Techniques provided herein, however, include methods of manufacture that provide for a self-aligned source and/or gate metallization while reducing the amount of photolithographic and etching steps. Moreover, embodiments provide for dielectric (e.g., oxide) spacers that can help prevent leakage current between the source and gate of the vertical JFET.

FIGS. 1-6C illustrate a process for creating a of vertical JFET that utilizes self-alignment techniques to form the gate metal structure (also referred to as gate contacts). Referring to FIG. 1, a first GaN epitaxial layer 120 is formed on a GaN substrate 110. As indicated above, the GaN substrate 110 can be a pseudo-bulk GaN material on which the first GaN epitaxial layer 120 is grown. Dopant concentrations (e.g., doping density) of the GaN substrate 110 can vary. For example, a GaN substrate 110 can have an n+ conductivity type, with dopant concentrations ranging from $1\times10^{17}$ cm$^{-3}$ to $1\times10^{19}$ cm$^{-3}$. Although the GaN substrate 110 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 120 can also vary, depending on desired functionality. The first GaN epitaxial layer 120 can serve as a drift region and channel for the vertical JFET, and therefore can be a relatively low-doped material. In some embodiments, the dopant concentration of the first GaN epitaxial layer 120 is lower than the dopant concentration of the GaN substrate 110. For example, the first GaN epitaxial layer 120 can have an n-conductivity type, with dopant concentrations ranging from $1\times10^{14}$ cm$^3$ to $1\times10^{18}$ cm$^{-3}$. Furthermore, the dopant concentration can be uniform, or can vary, for example, as a function of the thickness of the drift region and/or channel. In some embodiments, the first GaN epitaxial layer 120 can comprise two or more sublayers, which can have differing physical characteristics (e.g., dopant concentrations, dopant uniformity, etc.)

The thickness of the first GaN epitaxial layer 120 can also vary substantially, depending on the desired functionality. As discussed above, homoepitaxial growth can enable the first GaN epitaxial layer 120 to be grown far thicker than layers formed using conventional methods. For example, in some embodiments, thicknesses can vary between 0.5 μm to 100 μm or more. Resulting breakdown voltages for the vertical JFET can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, or the like. P-type dopants can include magnesium, beryllium, zinc, or the like.

A second GaN epitaxial layer 130 can be coupled to the first GaN epitaxial layer 120. The second GaN epitaxial layer 130, which eventually can comprise the source of the vertical JFET, can be a highly-doped epitaxial layer of the same conductivity type as the first GaN epitaxial layer 120 and the GaN substrate 110. In general, the dopant concentration of the second GaN epitaxial layer 130 can exceed the dopant concentration of the first GaN epitaxial layers 120. For example, an n-type dopant concentration of the second GaN epitaxial layer 130 can be equal to or greater than $1\times10^{18}$ cm$^{-3}$.

The thickness of the second GaN epitaxial layer 130 can impact the contact resistance and current flow properties of the vertical JFET. In some embodiments, thicknesses can be between 500 Å and 1 μm, for example 0.1 μm. As described below, some embodiments with self-aligned source and/or gate metallization may include a thicker highly-doped layer 130. For example, the thickness of layer 130 may be between 0.2 μm and 0.6 μm. Moreover, the doping of layer 130 may be graded, with lower doping at the bottom and higher doping near the surface.

A first masking layer 140 is uniformly formed above the second GaN epitaxial layer 130. The first masking layer 140 can comprise any of a variety of materials, such as oxides and/or nitrides, which can be used as a mask in selective etching processes described below. The thickness of the first masking layer 140 can vary depending on composition and manufacturing concerns. In some embodiments the thickness of the first masking layer 140 is between about 0.1 μm and 5 μm.

In some embodiments, a second masking layer 150 may be uniformly formed above the first masking layer 140. Similar to the first masking layer 140, the second masking layer 150 can comprise any of a variety of materials that can be used as a mask in selective removal (e.g., etching) processes described below. For example, in some embodiments, the second masking layer 150 comprises polysilicon and/or another material with very high etch selectivity to the first masking layer 140. Here, too, the thickness of the second masking layer 150 can vary depending on composition, the subsequent etching processes, and other concerns. In some embodiments the thickness of the second masking layer 150 is between about 0.1 μm and 5 μm.

Figure 2:
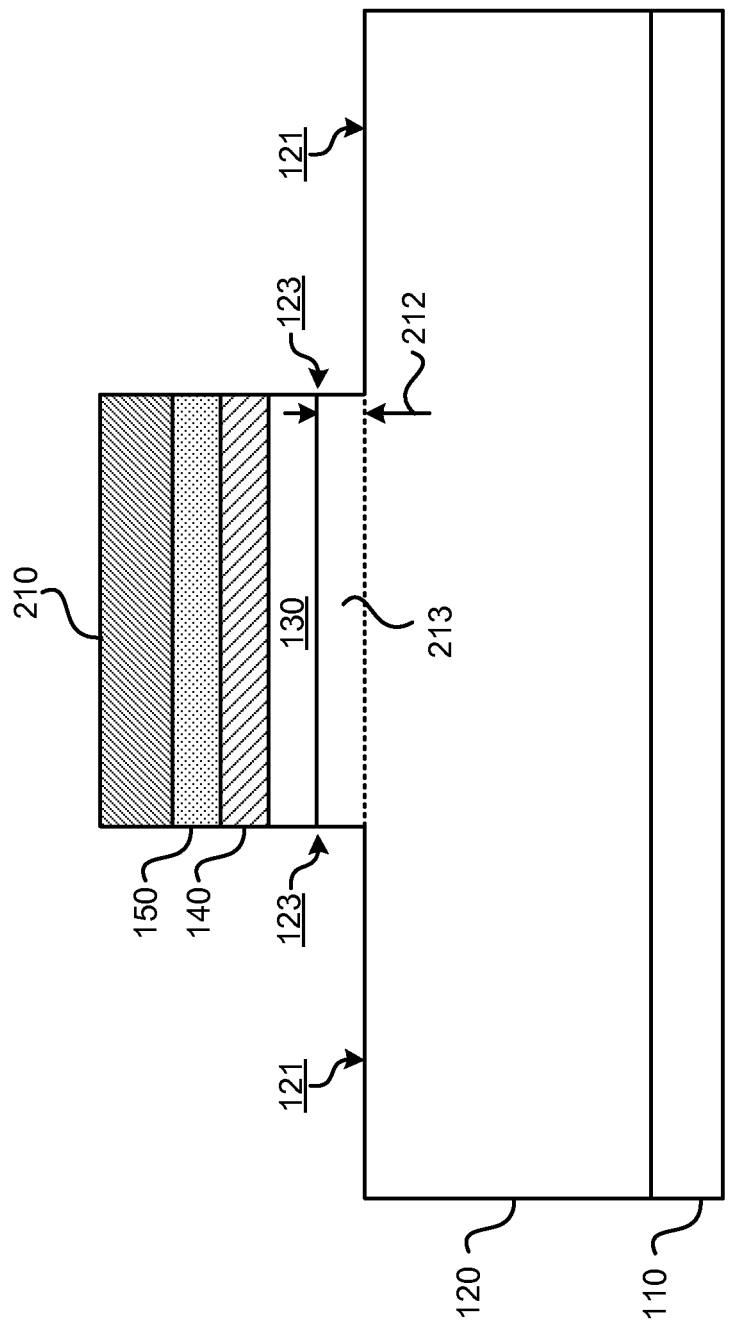

Referring to FIG. 2, a photoresist mask 210 is coupled to the second masking layer 150, and exposed portions of the second masking layer 150, the first masking layer 140, and the second GaN epitaxial layer 130 are removed to expose a top surface 121 of the first GaN epitaxial layer 120. To help ensure that exposed portions of the second GaN epitaxial layer 130 are fully removed, the removal process may also include removing portions of the first GaN epitaxial layer 120. This can create vertical surfaces 123 in the first GaN epitaxial layer 120, which can vary in depth, depending on the accuracy and tolerances of the removal process. For example, if the second GaN epitaxial layer 130 is 0.1 μm in thickness, the removal process may be configured to remove a total of 0.15 μm of material, to ensure that portions of the second GaN epitaxial layer 130 are fully removed. In this example, this would lead to a height 212 of the portion of the first GaN epitaxial layer removed of approximately 0.05 μm. As illustrated in FIG. 2, the removal of a portion of the first GaN epitaxial layer produces an extension region 213 between the dotted line and the second GaN epitaxial layer 130 and extending to the height 212. The vertical surfaces 123 thus extend along the sides of the extension region as well as the sides of the source region as described more fully below.

The removal of exposed portions of the second masking layer 150, the first masking layer 140, and the second GaN epitaxial layer 130 can involve a single etching process comprising a series of etching steps, which can reduce processing time. Because the different layers are composed of different materials, each etching step may include different gasses and other process parameters to change the etch rate of each layer in each etching step. For example, a first etching step may provide a high etch rate of second masking layer 150, a second etching step may provide a high etch rate for the first masking layer, and a third etching step may provide a high etch rate for the GaN layers 130 and 120.

Figure 3:
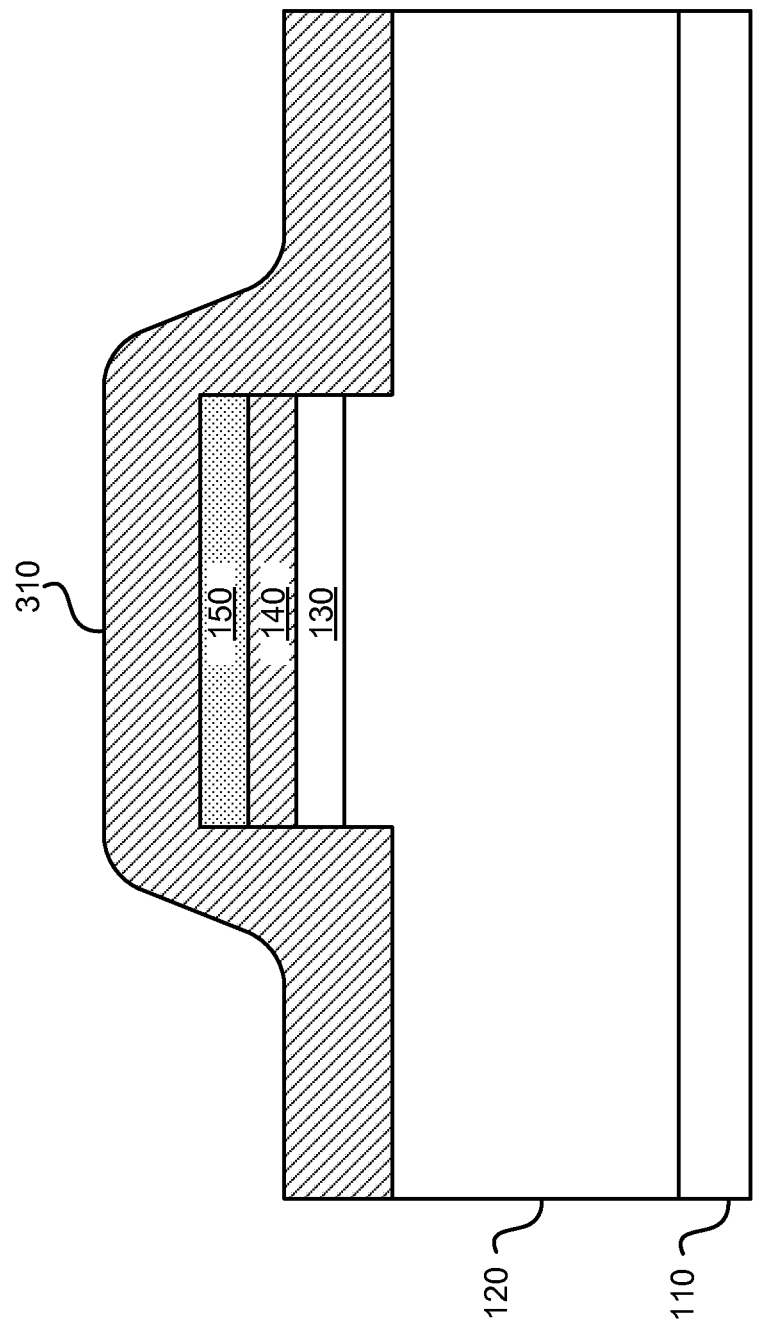
Figure 4:
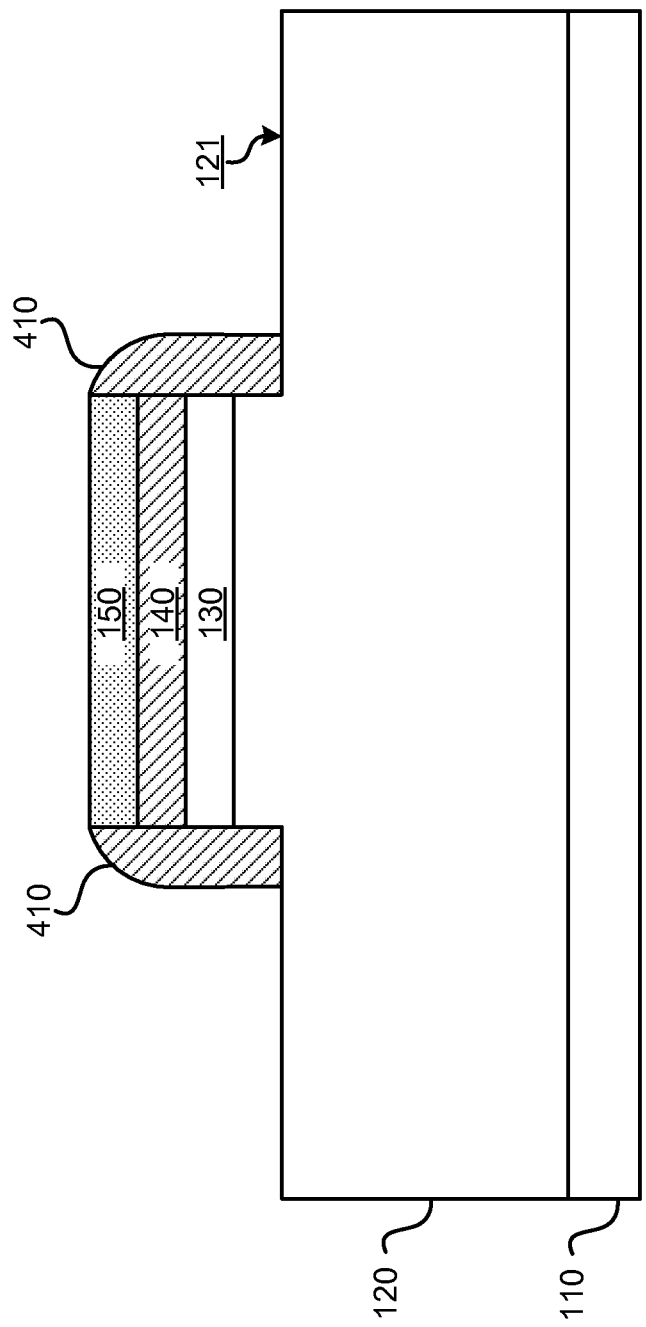

FIGS. 3 and 4 illustrate how a spacer layer 310 can be deposited and/or otherwise formed to cover the surfaces 121 of the first GaN epitaxial layer 120, as well as the other structures, then removed (e.g., etched) to create spacers 410 that are coupled to the sides of the masking, insulating, and second GaN epitaxial layers 150, 140, 130. Spacer layer 310 may comprise an insulating material such as dielectrics including silicon dioxide, silicon nitride, similar materials, or combinations thereof. The removal of portions of spacer layer 310 can include a dry etch, such as a Reactive-Ion Etching (RIE) process, that is selective to spacer layer 310, i.e. this etching step may have a much higher etch rate for spacer layer 310 than for GaN layer 120 and first masking layer 150. The second masking layer 150 can thus protect the first masking layer 140 from the etching process, so that first masking layer 140 is available to act as to protect GaN layer 130 is subsequent process steps. The deposition and anisotropic etching of spacer layer 310 results in a self-aligned process that creates one or more spacers 410 along the sidewalls of vertical surfaces 123 of second GaN epitaxial layer 130 and first GaN epitaxial layer 120.

Figure 5:
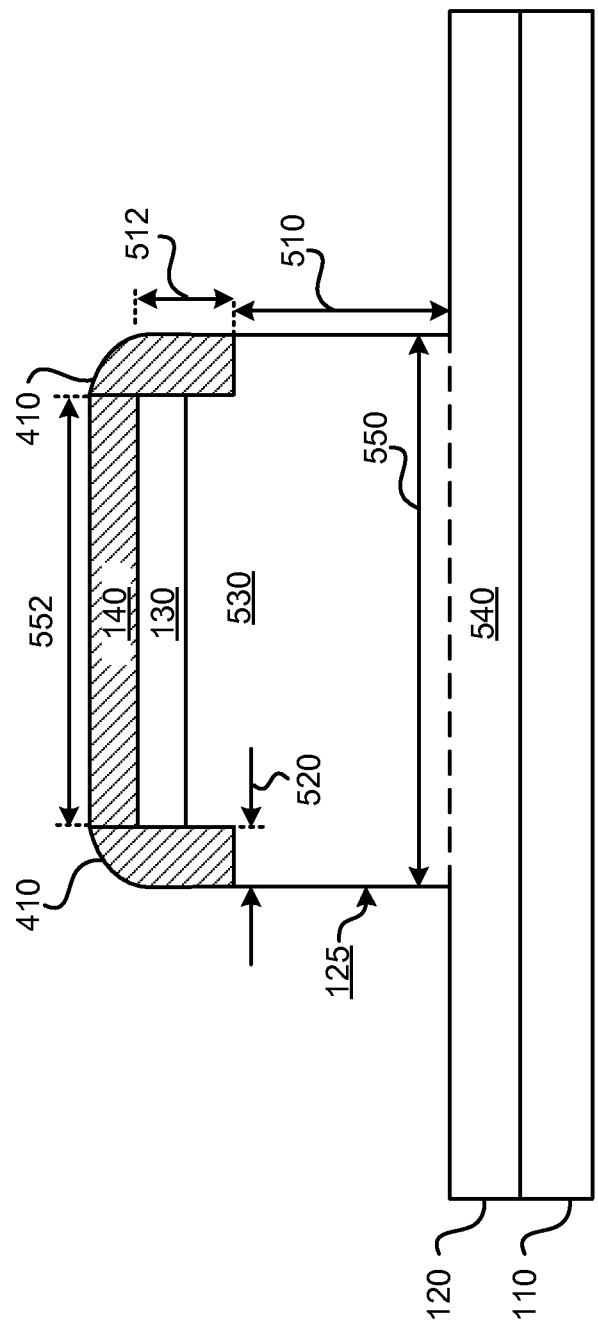

FIG. 5 is a simplified cross-sectional diagram illustrating the removal of at least a portion of the first GaN epitaxial layer 120 to form the channel structure 530 and a drift region 540 in the process of manufacturing the vertical JFET. The channel structure 530 can include a channel region 351A and an extension region 531B. The removal can be performed by a controlled etch selective to GaN, i.e., an etch in which GaN has a much higher etch rate than the first masking layer 140 and the spacers 410. In some embodiments, second masking layer 150 may be substantially etched or completely removed by this etching step. Masking layer 140 preferably prevents this etching step from attacking the underlying portions of second GaN epitaxial layer 130 and first GaN epitaxial layer 120. Inductively-coupled plasma (ICP) etching and/or other suitable GaN etching processes can be used. This results in the creation of a mesa in the first GaN epitaxial layer 120 that is laterally self-aligned with respect to the vertical surfaces 123 of the second GaN epitaxial layer 130, which forms the source of the vertical JFET. The lateral self-alignment is facilitated by the spacers 410, which define a lateral separation between the vertical surfaces 123 of the second GaN epitaxial layer 130 and the channel sidewalls 125 of the channel structure 530. In some embodiments, the channel sidewalls and the sidewalls of the first GaN epitaxial layer aligned with the sidewalls of the source region bound the channel and define an extension region extending in a vertical direction with respect to the surface of the III-nitride substrate. Thus, the channel structure can include a channel region and an extension region and can have a differing width as a function of height. Referring to FIG. 5, the source region 130 is coupled to a top surface the extension region, which is characterized by a narrower width at portions farther from the III-nitride substrate (i.e., the channel region).

The width 550 of a portion of the channel structure 530 can vary, depending on numerous factors such as desired functionality of the vertical JFET, dopant concentrations of channel structure 530, as well as other factors. For example, for a normally-off vertical JFET in which the channel structure 530 has a dopant concentration between $1 \times 10^{14}$ cm$^{-3}$ and $1 \times 10^{17}$ cm$^{-3}$, the width 550 of the channel structure 530 can be between 0.1 μm and 2 μm. For a normally-on vertical JFET, the width 550 of the channel structure 530 can be greater than for a normally-off vertical JFET. The electrical performance of the vertical JFET is generally improved as the width 550 of channel structure 530 decreases. Smaller widths 550 allow the JFET to achieve a high threshold voltage and good off-state leakage characteristics with higher doping in channel structure 530, which improves the on-state characteristics of the JFET. If the width 550 is too narrow, however, it limits the saturation current of the JFET. Thus, in a preferred embodiment, the width 550 of channel 530 is between 0.2 μm and 0.8 μm, and the dopant concentration in channel 530 is between $1 \times 10^{16}$ cm$^{-3}$ and $3 \times 10^{16}$ cm$^{-3}$. As illustrated in FIG. 5, the channel structure includes channel sidewalls 125, which can be substantially vertical.

The removal of portion(s) of the first GaN epitaxial layer 120 additionally can determine the length 510 of a lower portion of the channel structure 530, which can also vary depending on the desired functionality. For example, although a relatively long lower portion length 510 can provide increased gate control of the JFET, it also has increased resistivity, which can be undesirable in many applications. In some embodiments, length 510 can be between 0.25 μm and 10 μm. In a preferred embodiment, length 510 is between 1.0 μm and 3.0 μm.

The spacers 410 can provide electrical insulation between the source and gate structures of the vertical JFET. As such, the physical characteristics of the spacers 410 can be adjusted according to desired functionality. For example, according to some embodiments, the width 520 of the spacers 410 can be between 0.01 μm and 0.5 μm. The width 520 of spacers 410 should be thick enough to serve as an effective mask during the subsequent selective epitaxial regrowth process. However, increasing thickness of spacers 410 increases the difference between the width 550 of the portion of the channel structure 530 and the width 552 of the source region 130. It is desirable to minimize this difference in some embodiments, because the width 552 is a critical dimension in the fabrication process (i.e. smaller widths 552 require more difficult and expensive photolithography and etching processes), while the width 550 should be made as small as possible to enhance the electrical performance of the vertical JFET. Thus, in a preferred embodiment, the width 520 is between 0.01 μm and 0.10 μm.

Increasing the vertical depth 512 between the top of source region 130 and the top of the lower portion of channel structure 530 can degrade some aspects of the electrical performance of the JFET, because this region of the device adds series resistance, yet it is not well controlled by the gate of the JFET. However, in some embodiments, an increased depth 512 is used to provide processing advantages. For example, a larger depth 512 can enable or simplify the formation of self-aligned gate metallization and self-aligned source metallization, as described in more detail below. In some embodiments, source region 130 may include a highly doped layer that extends vertically substantially to the top of channel structure 530. In other embodiments, the doping of the material included in source region 130 may be graded, with higher doping near the surface for improved contact resistance, and lower doping near the top of channel structure 530.

FIG. 6A illustrates the formation of gate structures 610 that together function as the gate for the vertical JFET. The gate structures 610 have a conductivity type different than the channel structure 530. For instance, if the channel structure 530 is formed from an n-type GaN material, the gate structures 610 will be formed from a p-type GaN material, and vice versa.

The gate structures 610 can be formed through a selective epitaxial regrowth process for III-nitride materials. Due to the composition of the spacers 410 and the first masking layer 140, GaN is inhibited from forming on the spacers 410 and first masking layer 140 during the epitaxial growth process. This results in the selective formation of the gate structures 610 in regions adjacent to the channel structures 530 of the JFETs (i.e., coupled to side surfaces of the mesa formed in the first GaN epitaxial layer 120), thereby forming gates in a self-aligned manner. Although the gate structures 610 of FIG. 6 are shown as having a top surface approximately level with a bottom surface of the spacers 410, this can vary among different embodiments. In some embodiments, the top surface of the gate structures 610 may be above or below the bottom surface of the spacers 410. Because the spacers 410 are disposed between the gate structures 610 and the second GaN epitaxial layer 130, they provide a self-aligned spacing between the source and gate of the vertical JFET. In some embodiments, spacers 410 remain in the final vertical JFET structure. In other embodiments, spacers 410 are removed during subsequent processing steps. In either case, the self-aligned spacing enabled by spacers 410 provides electrical insulation between the source and gate, which can improve performance and prevent current leakage.

The gate structures 610 can be highly doped, for example in a range from about $5 \times 10^{17}$ cm$^{-3}$ to about $1 \times 10^{20}$ cm$^{-3}$. Additionally, as with other epitaxial layers, the dopant concentration of the gate structures 610 can be uniform or non-uniform as a function of thickness. In some embodiments, the dopant concentration increases with thickness, such that the dopant concentration is relatively low near the bottom surface of the gate structures 610 and increases as the distance from the bottom surface increases. Such embodiments provide higher dopant concentrations at the top of the gate structures 610 where metal contacts can be subsequently formed.

One method of forming the gate structures 610, and other layers described herein, can be through a regrowth process that uses an in-situ etch and diffusion preparation processes. These preparation processes are described in U.S. patent application Ser. No. 13/198,666, filed Aug. 4, 2011, entitled "METHOD AND SYSTEM FOR FORMATION OF P-N JUNCTIONS IN GALLIUM NITRIDE BASED ELECTRONICS," the entirety of which is hereby incorporated by reference.

Figure 6B:
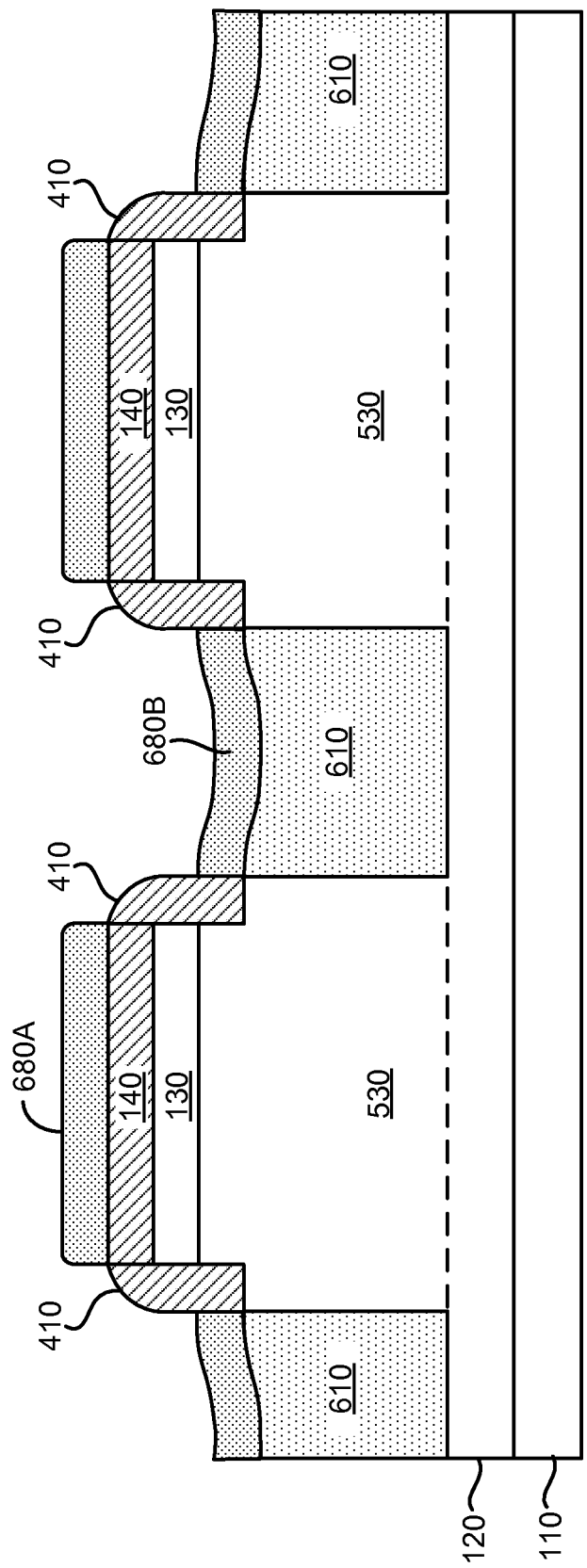

As illustrated below, embodiments of the present invention provide for the self-alignment of one or more of the metallization structures (e.g., gate metal structures) utilized in the devices illustrated herein. FIG. 6B illustrates the self-alignment of the p-ohmic contact to the gate. As illustrated in FIG. 6B, a metal liftoff process is used to form metal layers 680A and 680B. In comparison to a metal liftoff process in which photoresist is used, embodiments of the present invention utilize first masking layer 140 (e.g., a dielectric material) and spacers 410 during the liftoff process.

Referring to FIG. 6B, metal layers 680A and 680B (also referred to as gate metal structures) are blanket deposited over the mesas, with a gap between these layers resulting in little to no deposition on the sidewalls of spacers 410. The metal deposition process may be at least partially non-conformal, e.g. able to deposit on the substantially horizontal top surfaces of regions 140 and 610, yet unable to deposit on the substantially vertical sidewall surfaces of spacers 410. The vertical height of the mesas is optimized in some embodiments relative to the thickness of gate metal structures to provide a separation between the portions 680A on regions 140 and portions 680B on regions 610.

Figure 6C:
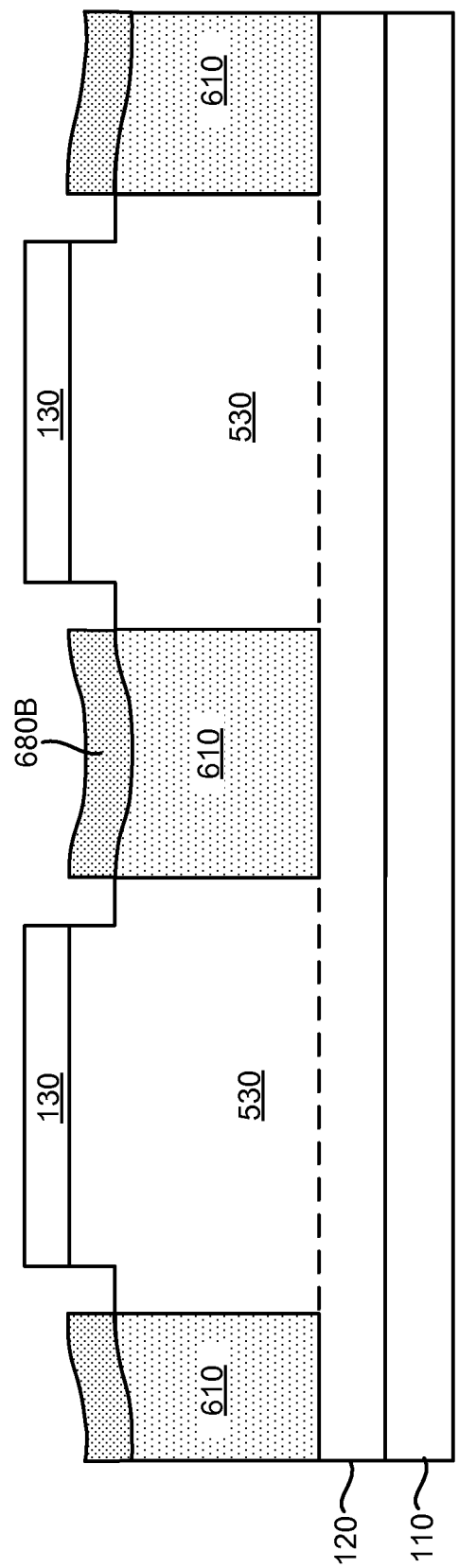

Referring to FIG. 6C, a selective etching process such as a dielectric removal process (e.g., a wet dielectric etch) is used to lift off the metal layer 680A on top of the mesa, exposing source region 130 and leaving the gate contact formed using metal layer 680B. In an exemplary embodiment, a wet etching process including hydrofluoric acid may be used to remove the dielectric layers (e.g. oxide and/or nitride layers) of spacers 410 and first masking layer 140 without substantially etching GaN regions 130, 530, or 610, nor substantially etching gate metal structures 680B. As regions 140 and 410 are removed, gate metal structures 680A are undercut and lifted off (i.e. removed) from the structure, leaving gate metal structure 680B on top of gate structures 610 and substantially self-aligned to the edges of channel structures 530. The presence of the sidewall features during the liftoff process enable the gate contact to be self-aligned and formed without the use of a photolithography process.

Figure 6D:
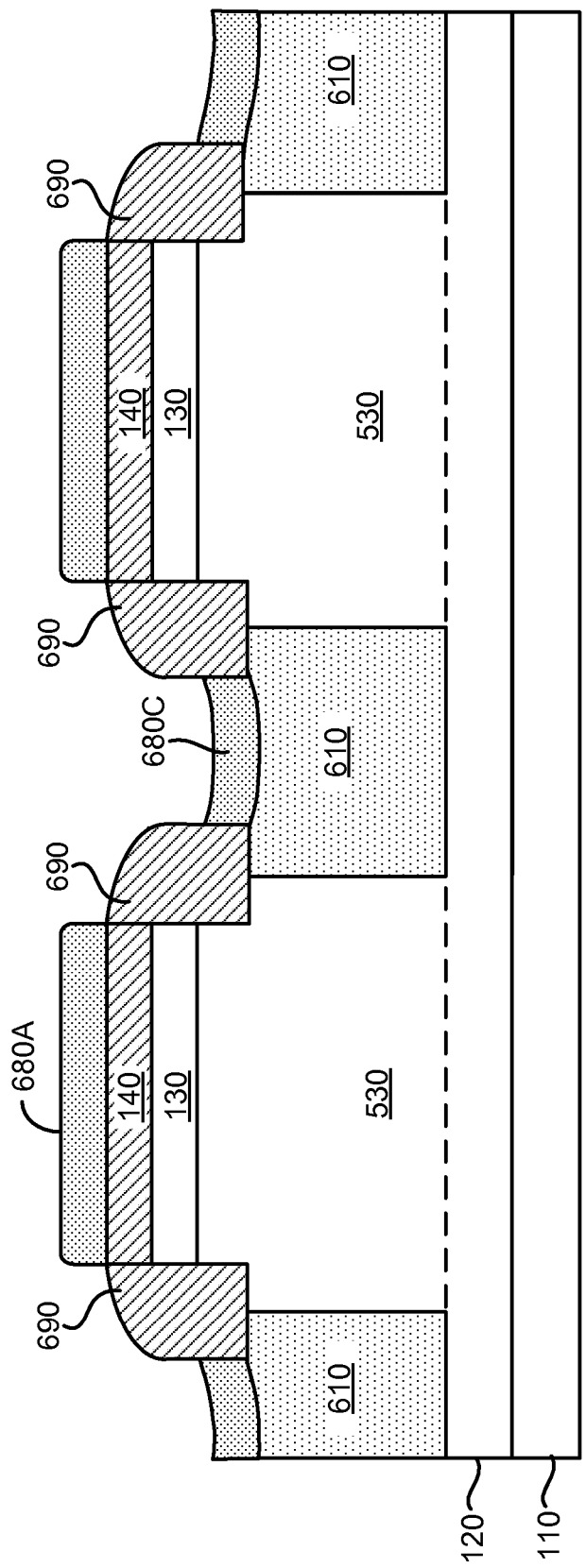
FIGS. 6D and 6E are simplified cross-sectional diagrams illustrating portions of a JFET according to an alternative embodiment of the present invention.
Figure 6E:
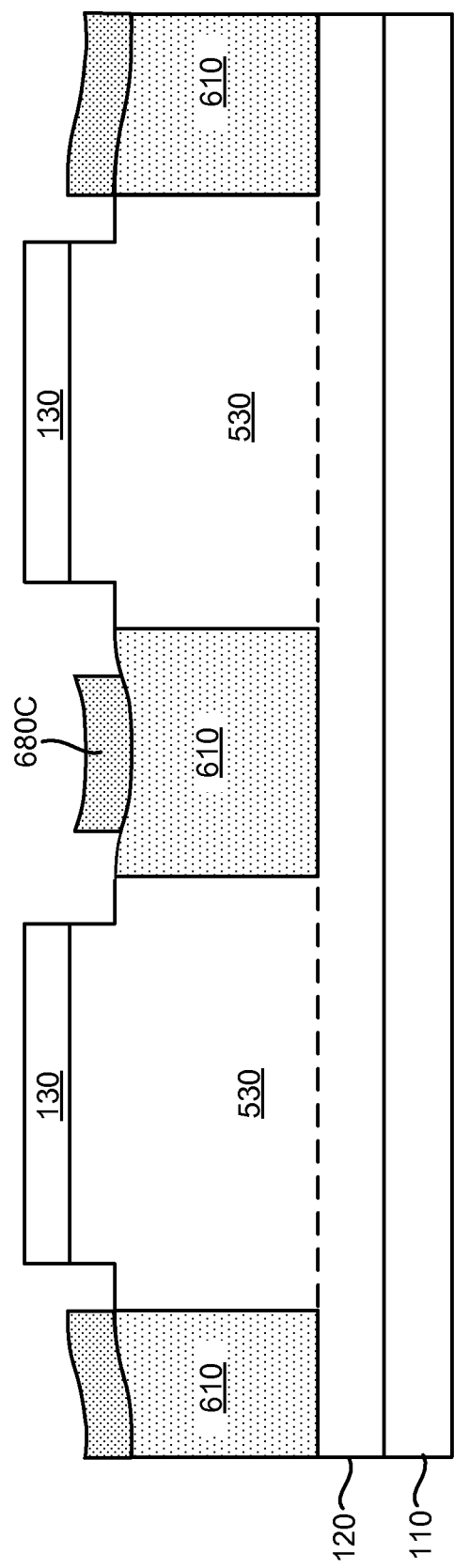

FIG. 6D illustrates an alternative embodiment in which an additional sidewall spacer, is formed on the sidewalls of spacers 410 prior to the liftoff process to form gate spacer 690. Gate spacer 690 will increase the lateral separation of metal layers 680A and 680B, facilitating the liftoff process. As illustrated in FIG. 6E, gate metal structure 680C is still self-aligned to the edges of channel structures 530, although with a smaller lateral extent than that characterizing the metal contact 680B illustrated in FIG. 6C. Thus, embodiments of the present invention reduce the use of photolithography processes during gate metal definition steps, reducing processing complexity, decreasing device pitch, and increasing device density. The spacers 690 provide some additional lateral separation between gate metal structure 680C and the edge of channel structure 530. This may be advantageous if contact between metal 680C and channel 530 caused some undesirable characteristics such as leakage between gate and source.

The techniques utilized to fabricate sidewall spacers 410 can be utilized in fabricating the gate spacer 690, for example, processes similar to those described in reference to FIGS. 3 and 4, above can be used prior to the formation of gate metal structures 680A and 680C. As an example, a blanket deposition of dielectric material can be performed followed by an anisotropic etch (e.g., an RIE etch) to produce gate spacer 690. In some embodiments, the width of gate spacer 690 may be in the range of 0.01 µm to 0.50 µm.

The self-alignment of gate metal structures 680B/680C to channel structures 530 may provide several important advantages in some embodiments. First, it eliminates a photolithography step, reducing processing cost. Second, it eliminates a critical alignment step, allowing the width of gate structures 610 to be reduced, resulting in a more compact and area-efficient device. Third, the effective sheet resistance of gate structures 610 is reduced because they are substantially covered by gate metal structures 680B/680C, which comprise a material with much lower resistance.

In addition to self-alignment of gate contacts, embodiments of the present invention provide for self-alignment of the source contacts for JFETs and other electronic devices.

Figure 7A:
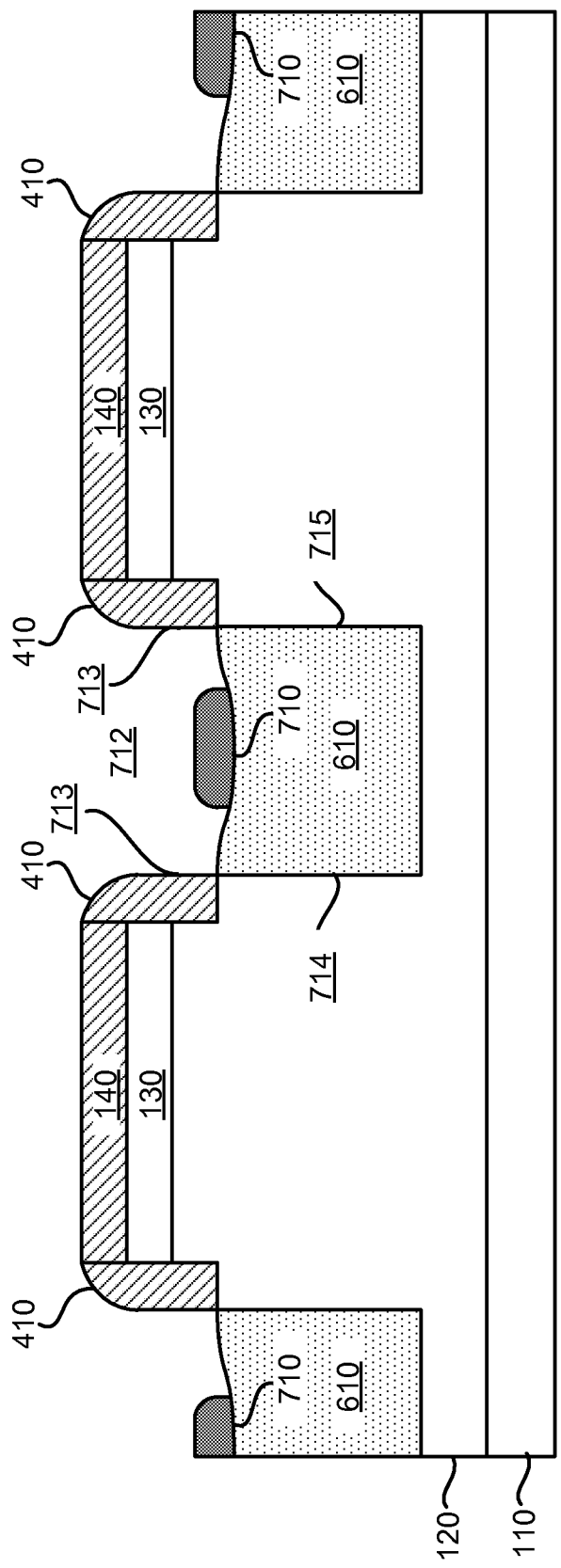
FIGS. 7A-7D are simplified cross-sectional diagrams illustrating portions of a JFET according to a particular embodiment of the present invention.

FIG. 7A illustrates the formation of one or more gate metal structures 710 on the gate structures 610 to form an electrical contact to the gates of the vertical JFET. The gate metal structures 710 can include one or more layers of metal, including metals and/or alloys, configured to provide an ohmic contact to the gate structures 610. When p-type GaN is used for gate structures 610, for example, the bottom layer of gate metal structures 710 can comprise platinum, palladium, nickel, or similar ohmic metal. Other metals and/or alloys for the upper layers of metal structures 710 including, but not limited to, aluminum, titanium, nickel, gold, combinations thereof, or the like The gate metal structures 710 can be formed using any of a variety of methods such as sputtering, evaporation, or the like. Materials utilized in fabricating gate metal structures 710 are applicable to gate metals 680B/C as will be evident to one of skill in the art.

In FIG. 7A, gate metal structures 710 are laterally separated from spacers 410, as would be the case if gate metal structures 710 were aligned using a photolithography process. In some embodiments, gate metal structures 710 may be deposited in a self-aligned manner, such that gate metal structures 710 cover substantially the entire exposed surfaces of gate structures 610 as illustrated in FIG. 6C. A trench 712 is present over the gate metal structure and is defined, in part, by sidewalls 713 extending in a substantially vertical direction with respect to the epitaxial layers.

Figure 7B:
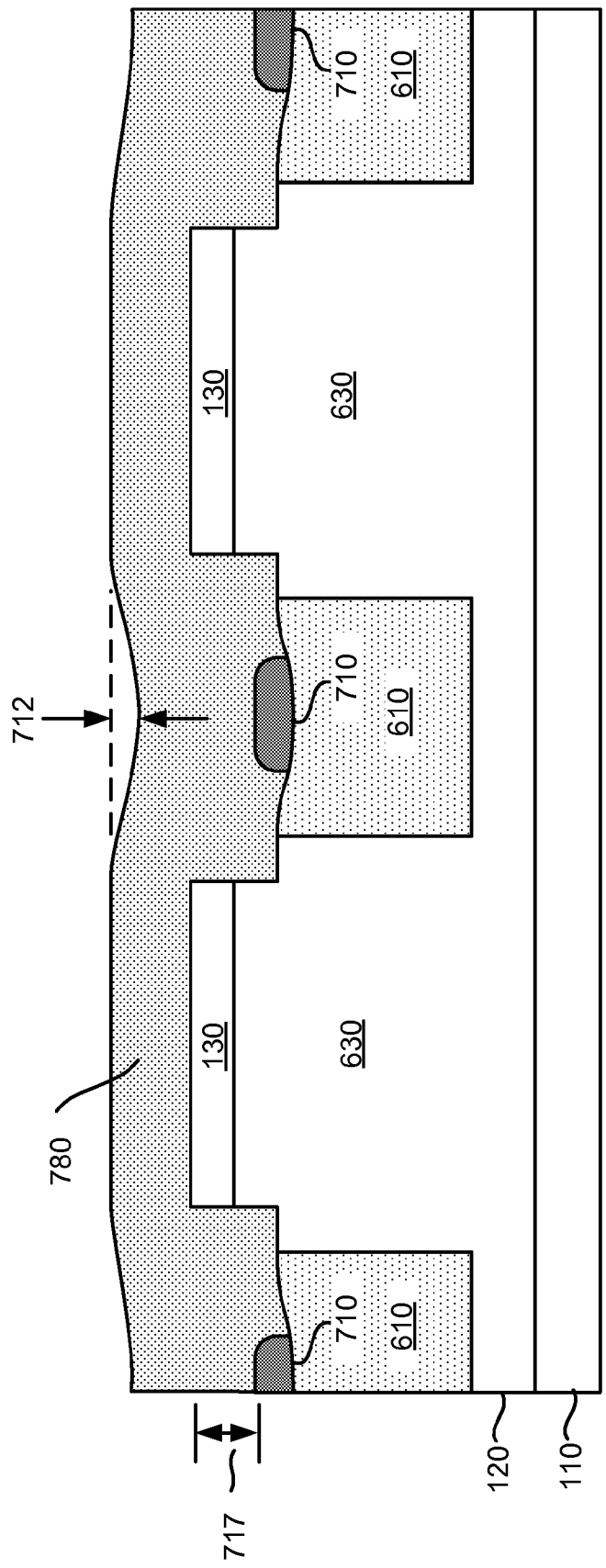
Figure 7C:
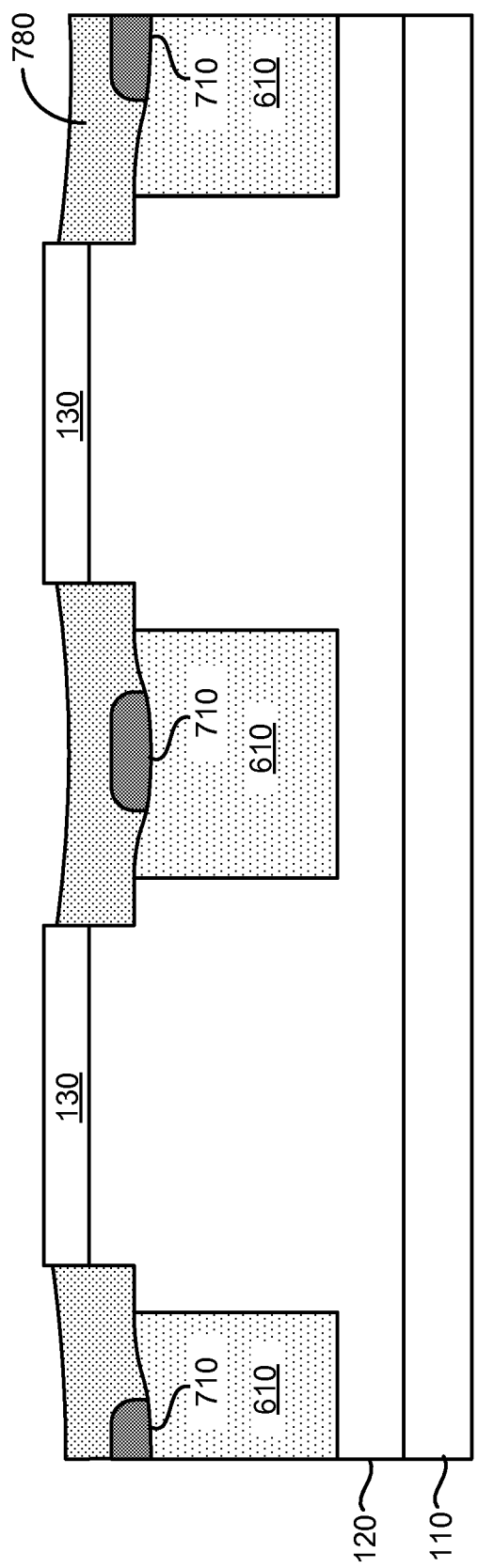
Figure 7D:
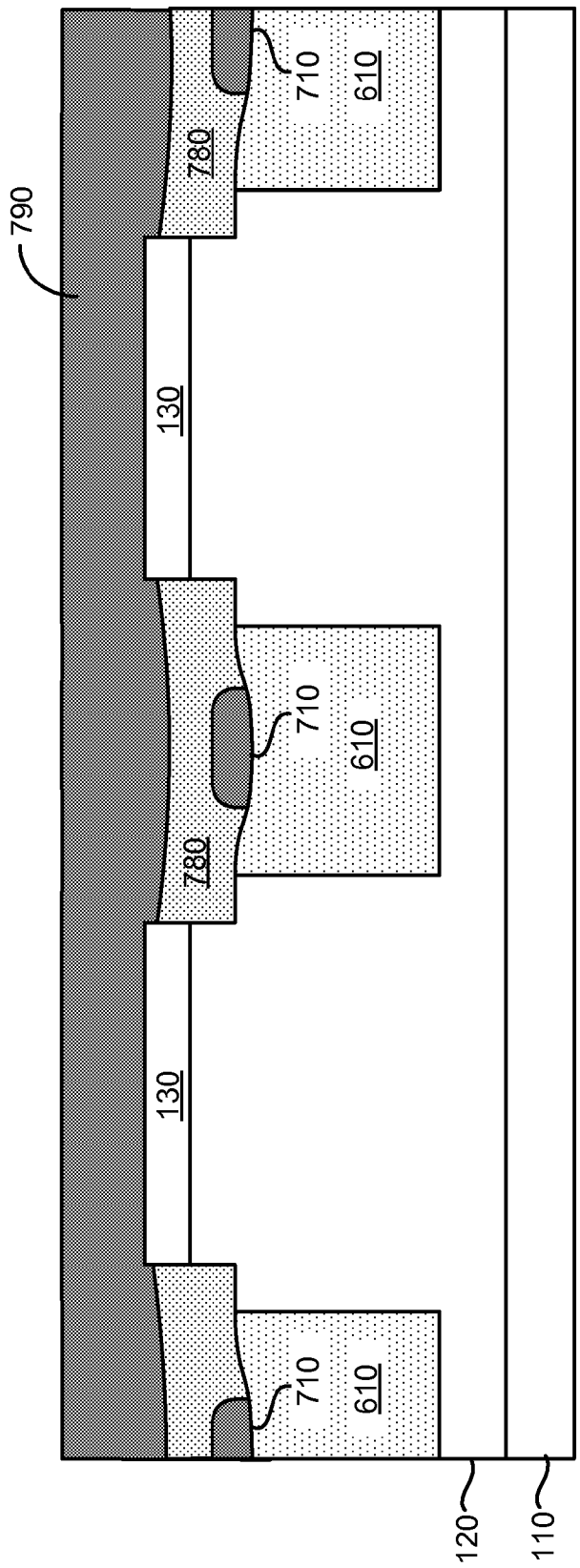

FIGS. 7B-7D illustrate a method for providing self-alignment between the source electrode and the source regions of a vertical JFET. FIG. 7A is illustrated as a starting point to illustrate the method, but the structure illustrated in FIG. 6C or 6E with self-aligned gate metal could also be used. In the embodiment of FIG. 7B, first masking layer 140 and spacers 410 have been removed from the structure of FIG. 7A. In other embodiments, one of both of these layers may remain.

One of ordinary skill in the art would recognize many variations, modifications, and alternatives. In FIG. 7B, an ILD layer 780 is formed on the structure of FIG. 7A. ILD layer 780 is formed such that it substantially fills up the space above gate structures 610 and gate metal structures 710, between adjacent channel structures 630 and source regions 130, and covers the top of source regions 130. ILD layer 780 at least partially planarizes the structure, such that the first vertical distance 712 between the highest point and the lowest point on the surface of ILD 780 is substantially less than a second vertical distance 717 of gate metal region 710 and the top of source region 130. A variety of dielectric materials can be utilized to form ILD layer 780 including deposited oxides, spin-on-glass materials and the like.

FIG. 7C illustrates the structure after ILD layer 780 has been partially removed to expose the tops of source regions 130. The partial removal of ILD layer 780 may be accomplished by a substantially anisotropic etching process (e.g., reactive ion etching). This etching process removes enough of ILD layer 780 to expose the top of source region 130, but leaves a portion of ILD layer 780 covering gate structures 610 and gate metal 710.

FIG. 7D illustrates the structure after formation of pad metal structure 790. Because of the planarization and etch-back of ILD layer 780, described above, pad metal structure 790 contacts substantially the entire width of source regions 130 and is thus self-aligned to the source regions. The remaining portions of ILD layer 780 provide electrical isolation between pad metal structure 790 and gate metal 710. In a specific embodiment, gate contact openings are formed in portions of ILD layer 780 at a different location (not shown in the cross-section illustrated in FIG. 7D) prior to the formation of pad metal structure 790. These gate contact openings can be provided by photolithography and etching steps to allow contact of pad metal structure 790 to the gate metal 710 and thereby to gate structures 610 of the JFET. After the formation of pad metal structure 790, another masking step (not shown) may be used to pattern pad metal structure 790 into a source electrode and a gate electrode. The source electrode is the portion of pad metal structure 790 in contact with source regions 130, as shown in FIG. 7D, providing for parallel contact to the sources. The gate electrode, not shown in this figure, is the portion of pad metal structure 790 in contact with the gate structure 610 and/or gate metal 710.

The structures illustrated in FIG. 6C and FIG. 7D provide self-aligned gate and source contacts, respectively. By using self-aligned gate contacts, in addition to potential reductions in photolithography alignment tolerances and number of steps, the gate contact can be reduced in lateral extent, enabling smaller gate regions and higher device density. Additionally, the use of a self-aligned source contact enables reductions in the lateral extent of the source pillar or mesa, enabling higher device density since the pillar width can approach the minimum critical dimension (CD) available using the given fabrication equipment. Some embodiments utilize both self-aligned gate and source contacts, providing benefits provided by the device illustrated in FIG. 6C as well as the benefits provided by the device illustrated in FIG. 7D.

Thus, such a device could include a III-nitride substrate and a first III-nitride epitaxial layer coupled to the III-nitride substrate and having an extension region extending in a vertical direction. The semiconductor device also includes a second III-nitride epitaxial layer coupled to a top surface of the extension region and a III-nitride gate structure coupled to a sidewall of the extension region and laterally self-aligned with respect to the extension region. The semiconductor device further includes a gate metal structure in electrical contact with the III-nitride gate structure and laterally self-aligned with respect to the extension region and a dielectric layer overlying at least a portion of the gate metal structure, wherein a top surface of the dielectric layer is substantially co-planar with the top surface of the extension region.

Figure 8:
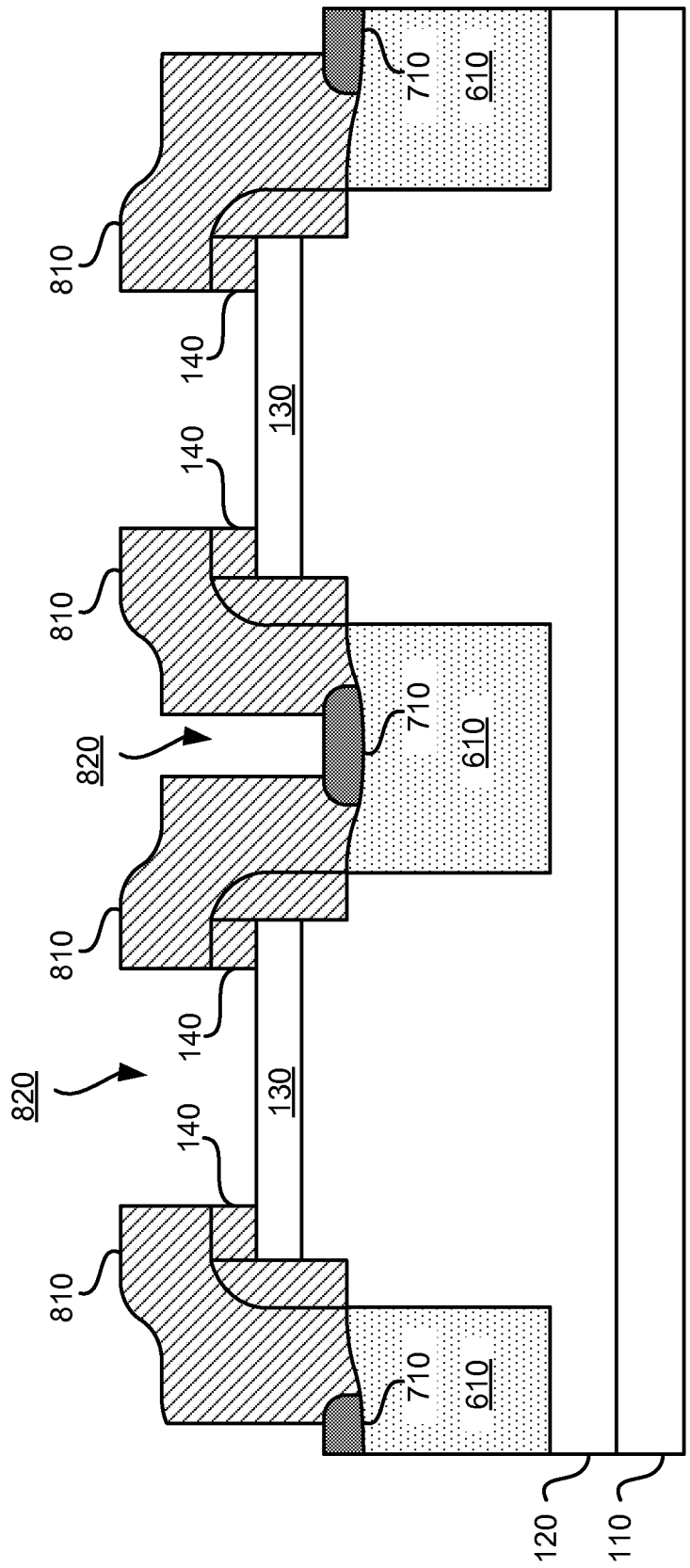
FIG. 8 is a simplified cross-sectional diagram illustrating the use of an inter-layer dielectric (ILD) according to an embodiment of the present invention.

FIG. 8 illustrates how an inter-layer dielectric (ILD) 810 may be formed over the existing structures and etched (and/or subject to other material removal processes) to form openings 820 that expose at least a portion of the metal structures 710 and/or the second GaN epitaxial layer 130. The ILD 810 can comprise any number of suitable dielectric layers, such as silicon dioxide, silicon nitride, spin-on glass, or other suitable materials, and the etch process may include the utilization of a photolithography and etching step to selectively etch portions of the ILD 810 to expose the metal structures 710 and/or the second GaN epitaxial layer 130.

In other embodiments (not shown), one or more additional masking processes may be used to form openings in the first masking layer 140 and then to form a source metal structure that makes ohmic contact to the second GaN epitaxial layer 130. These source metal structures and the gate metal structures 710 may then be covered by the ILD 810 and openings formed to expose portions of the gate metal structures 710 and the source metal structures (not shown).

Figure 9:
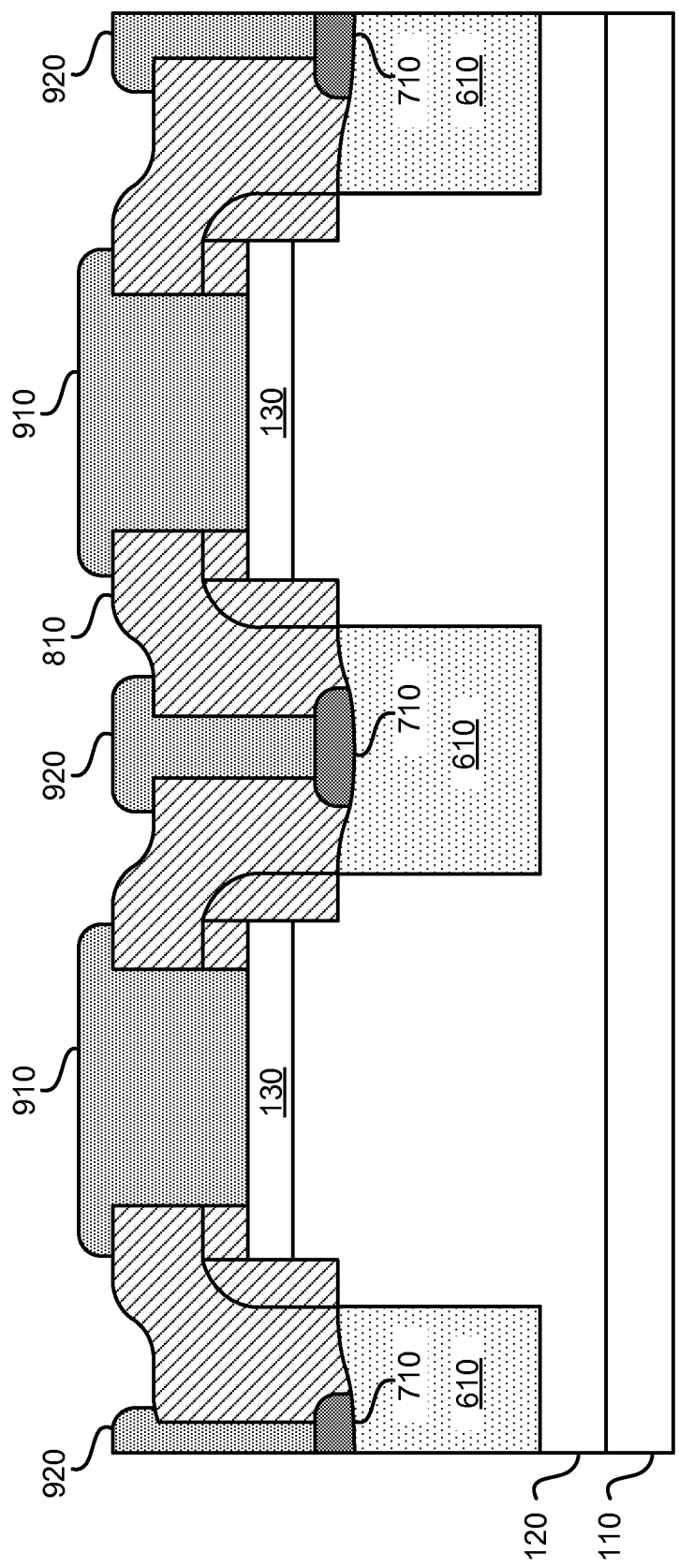
FIG. 9 is a simplified cross-sectional diagram illustrating one or more metal structures used to make electrical contact according to an embodiment of the present invention.

FIG. 9 illustrates the formation of one or more metal structures 910 to make electrical contact with the second GaN epitaxial layer 130, and the formation of one or more metal structures 920 to make electrical contact with the metal structures 710. In some embodiments, these metal structures 910, 920 may be formed at the same time, using the same materials. In such embodiments, the composition of the metal structures 910, 920 is such that it not only forms an ohmic metal contact with the second GaN epitaxial layer 130, but also forms a good contact with the metal structures 710 on the gate of the vertical JFET. In other embodiments, the etching and formation of metal structures 910, 920 can be separated such that metal structures 910 forming electrical contacts with the second GaN epitaxial layer 130 are formed separately from metal structures 920 forming electrical contacts metal structures 710, enabling different metals (and/or alloys) to be used for each type of metal structure 910, 920. The metal structures 910, 920 may include metals such as titanium, aluminum, nickel, gold, copper, or other suitable materials, and can be formed using any of a variety of methods such as sputtering, lift-off, evaporation, or the like. Although FIG. 9 illustrates gate contacts 710 and source contacts 910 that are defined using photolithography, embodiments of the present invention can substitute the self-aligned gate contacts 680B and source metal layer 790 as will be evident to one of skill in the art.

An issue presented by the processes illustrated in FIGS. 8 and 9 is that a photolithography masking step is utilized to form the opening 820 in ILD 810 to provide contact between metal structure 910 and GaN layer 130. Moreover, the feature size of this masking step is typically the smallest in the entire JFET process, and there is typically a critical alignment between this mask and the JFET source region (i.e. the top of region 130). This means that the minimum width 550 of channel 530 may be ultimately limited by the size of opening 820 and the alignment tolerance between opening 820 and the edges of GaN layer 130. As discussed previously with reference to FIG. 5, it is generally desirable to minimize the width 550 of channel 530.

The processes shown in FIGS. 1-9 are provided as examples only, and are not limiting. Furthermore, the figures are not drawn to scale, and the manufacture of the vertical JFETs can include additional steps and/or features that are not shown. For example, an ohmic metal contact may be created on the bottom of GaN substrate 110 to serve as the drain electrode of the JFET. The layers and/or structures described herein may include a number of sublayers, substructures, and/or other components to provide the functionality described herein. One of ordinary skill in the art would recognize many variations, modifications, and alternatives.

Figure 10A:
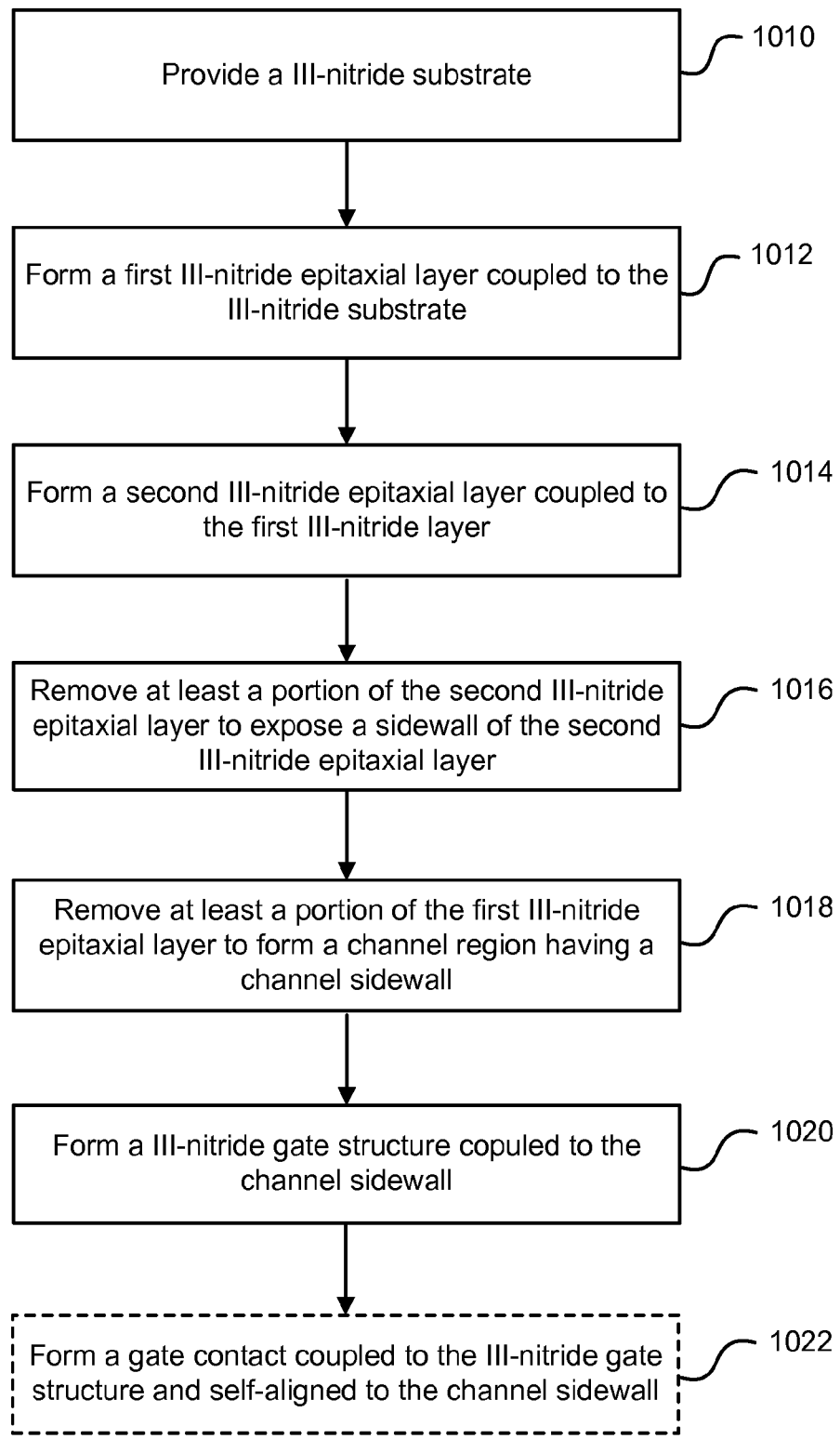
FIG. 10A is a simplified flowchart illustrating a method of fabricating a vertical JFET with self-aligned gate structure according to an embodiment of the present invention.

FIG. 10A is a simplified flowchart illustrating a method of fabricating a vertical JFET with self-aligned gate structure according to an embodiment of the present invention. In some embodiments, the vertical JFET is referred to as a controlled switching device. Referring to FIG. 10A, a III-nitride substrate is provided (1010). In an embodiment, the III-nitride is an n-type GaN substrate. The method also includes forming a first III-nitride epitaxial layer (e.g., an n-type GaN epitaxial layer) coupled to the III-nitride substrate (1012). The first III-nitride epitaxial layer can be characterized by a first dopant concentration, for example n-type doping. Using the homoepitaxy techniques, the thickness of the first III-nitride epitaxial layer can be thicker than available using conventional techniques, for example, between about 3 µm and about 100 µm.

The method further includes forming a second III-nitride epitaxial layer (e.g., a GaN epitaxial layer) coupled to the first III-nitride epitaxial layer (1014). The second III-nitride epitaxial layer can have a second dopant concentration of the same type and greater than the first dopant concentration, for example, an n-type layer with a higher doping concentration than the first III-nitride epitaxial layer. The method further includes removing at least a portion of the second III-nitride epitaxial layer to expose a sidewall of the second III-nitride epitaxial layer (1016). In some embodiments, the sidewall of the second III-nitride epitaxial layer is substantially vertical, whereas, in other embodiments, a predetermined angle other than orthogonal to the epitaxial layers is utilized. One of ordinary skill in the art would recognize many variations, modifications, and alternatives.

As illustrated in FIG. 2, the sidewall 123 of the second III-nitride epitaxial layer defines the lateral extent of layer 130. In some embodiments, a portion of the first III-nitride epitaxial layer is also removed during this step, such that the exposed surface is below the original surface of the first III-nitride epitaxial layer. As indicated previously, this removal process can be an etch that utilizes different precursor gasses to selectively etch the different layers during the removal process. It may also involve a masking and etching process that can include physical etching components as well as chemical etching components.

Additionally, the method includes removing at least a portion of the first epitaxial layer to form a channel structure having a channel sidewall (1018). Referring to FIG. 6, a sidewall spacer 410 may be formed prior to forming the channel sidewall 125 illustrated in FIG. 5. The sidewall spacer can be an electrically insulating material formed using the methods described herein. As illustrated in FIG. 5, the sidewall spacers 410 are self-aligned structures coupled to the vertical sidewalls of the stack of layers that includes the source and portions of the channel of the vertical JFET.

The process further includes forming a III-nitride gate structure (1020). This can include, for example, a selective epitaxial regrowth process. In some embodiments, no additional masking process is needed due to the material properties of spacers 410, which inhibit epitaxial growth, allowing for selective epitaxial growth coupled to the channel of the vertical JFET, forming a gate structure as illustrated in FIG. 6. In an alternative embodiment, a gate contact (also referred to as a gate metal structure) is formed that is self-aligned to the channel sidewall (1022). A liftoff process can be utilized as discussed above to form the gate contact. As indicated previously, the gate metal structure can comprise any of a variety of metals to form an ohmic metal contact with the III-nitride epitaxial gate structure. The gate metal structure may be self-aligned to the edges of adjacent channel structures of the JFET, covering a substantial portion of the gate structure and either in contact with the channel structures or laterally separated from each channel structure in a self-aligned manner.

It should be appreciated that the specific steps illustrated in FIG. 10A provide a particular method of fabricating a vertical JFET with a self-aligned gate structure according to an embodiment of the present invention. Other sequences of steps may also be performed according to alternative embodiments. For example, alternative embodiments of the present invention may perform the steps outlined above in a different order. Moreover, the individual steps illustrated in FIG. 10A may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 10B:
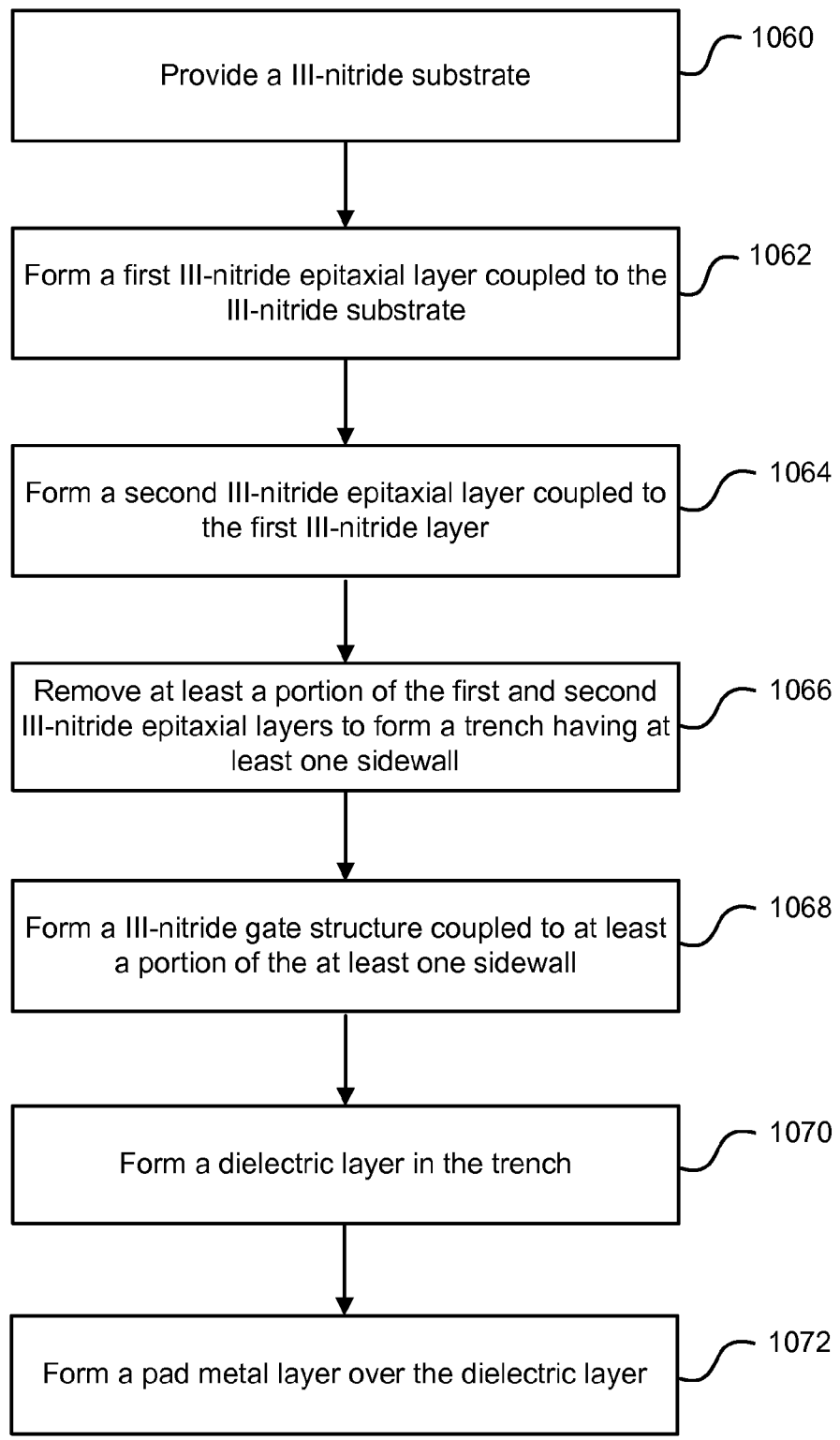
FIG. 10B is a simplified flowchart illustrating a method of fabricating a vertical JFET with self-aligned source structure according to an embodiment of the present invention.

FIG. 10B is a simplified flowchart illustrating a method of fabricating a vertical JFET with a self-aligned source structure according to an embodiment of the present invention. As illustrated in FIG. 7D, the method discussed in relation to FIG. 10B includes processes that enable the formation of self-aligned source contacts, as well as self-aligned gate structures and gate metallization for the vertical JFET. Referring to FIG. 10B, the method includes providing a III-nitride substrate (1060), forming a first III-nitride epitaxial layer having a first surface coupled to the III-nitride substrate and a second surface substantially opposite the first surface (1062), and forming a second III-nitride epitaxial layer coupled to the second surface of the first III-nitride epitaxial layer (1064).

The method also includes removing at least a portion of the first III-nitride epitaxial layer and the second III-nitride epitaxial layer to form a trench (1066). The trench has at least one sidewall disposed at an angle with respect to a dimension normal to the second surface, for example, a first vertical sidewall 714 defining a boundary of the gate structure and a second vertical sidewall 715 as illustrated in FIG. 7A. The method additionally includes forming a III-nitride gate structure coupled to at least a portion of the at least one sidewall (e.g., the first vertical sidewall 714) (1068). The use of dielectric spacers enables the formation of the III-nitride gate structure in a self-aligned manner. This process can include, for example, a selective epitaxial regrowth process. In some embodiments, no additional masking process is needed due to the material properties of the spacers, which inhibit epitaxial growth, allowing for selective epitaxial growth coupled to the channel of the vertical JFET, forming a gate structure. The method can include forming a gate metal structure coupled with the III-nitride epitaxial gate structure. As indicated previously, the gate metal structure can comprise any of a variety of metals to form an ohmic metal contact with the III-nitride epitaxial gate structure. The gate metal structure may be self-aligned to the edges of adjacent channel structures of the JFET, covering a substantial portion of the gate structure and either in contact with the channel structures or laterally separated from each channel structure in a self-aligned manner.

The method further includes forming a dielectric layer in the trench (1070), for example, an ILD layer, which covers the III-nitride gate structure. The ILD is then at least partially planarized and thinned to expose the top surface of second III-nitride layer while still covering the gate metal structure.

A pad metal structure is formed, coupled to the exposed surfaces of the first III-nitride layer, which forms the source region of the vertical JFET (1072). The pad metal structure can comprise any of a variety of metals to create an ohmic contact to the source region of the JFET and the gate metal structure. The pad metal structure can be patterned (e.g. by masking and etching or lift-off processing) so that the portion contacting the gate metal structure (i.e. the gate electrode) is electrically isolated from the portion contacting the source of the JFET (i.e. the source electrode).

It should be appreciated that the specific steps illustrated in FIG. 10B provide a particular method of fabricating a vertical JFET with a self-aligned source structure according to an embodiment of the present invention. Other sequences of steps may also be performed according to alternative embodiments. For example, alternative embodiments of the present invention may perform the steps outlined above in a different order. Moreover, the individual steps illustrated in FIG. 10B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 11:
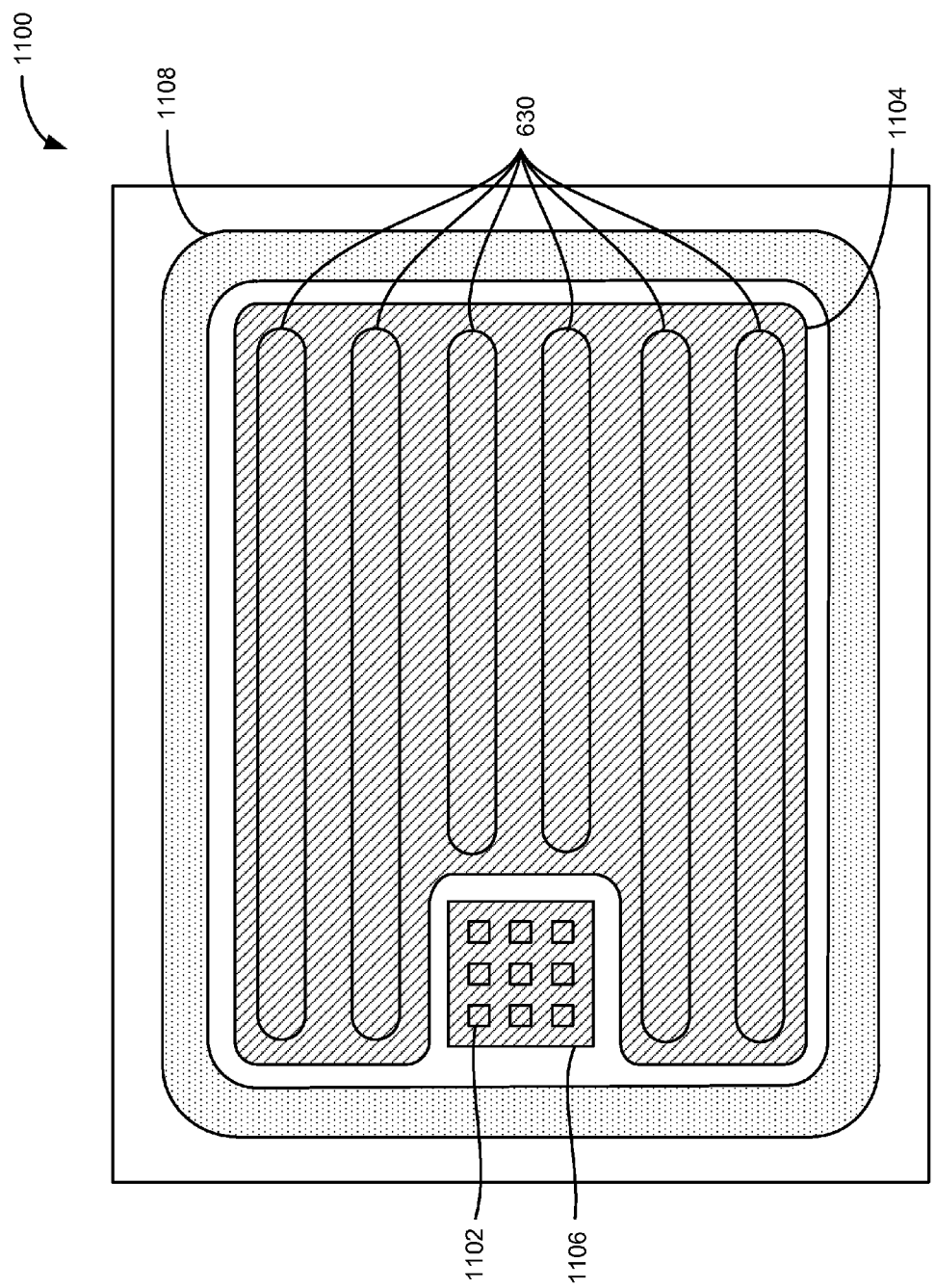
FIG. 11 is a plan view of a vertical JFET according to an embodiment of the present invention.

FIG. 11 is a plan view of a vertical JFET 1100 according to an embodiment of the present invention. Vertical JFET 1100, which is suitable for use as a power device in many applications includes a GaN epitaxial layer that is disposed on a GaN substrate (not shown), as described above. In this embodiment, channel structures 630 are formed as a plurality of fingers that are long and narrow. As described above in reference to FIG. 7D, gate regions surround channel structures 630 and may be contacted by gate metal. An ILD layer covers the gate regions and gate metal, and the tops of channel structures 630 are exposed (i.e. not covered by ILD). Gate contact openings 1102 are formed in the ILD above a region of the gate regions and/or gate metal that lies outside of the channel structure finger region. Gate contact openings are shown as a plurality of square openings, but in other embodiments comprise one or more openings of any combination of sizes and shapes. Source electrode 1104 covers the channel structures and is in electrical contact with the channel structures and/or source regions disposed at the top of the channel structures. Gate electrode 1106 covers the gate contact openings 1102 and is in electrical contact with the gate structures and/or gate metal. Source electrode 1104 and gate electrode 1106 may be formed from the same layer of pad metal 790, as described in reference to FIG. 7D. One or more edge termination structures 1108 may be formed near the outer periphery of JFET 1100. In a preferred embodiment, source electrode 1104, gate electrode 1106, and channel structures 630 are completely circumscribed by edge termination structure 1108.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device comprising:
   a III-nitride substrate;
   a channel structure coupled to the III-nitride substrate, wherein the channel structure comprises a first III-nitride epitaxial material and is characterized by one or more channel sidewalls;

a source region coupled to the channel structure, wherein the source region comprises a second III-nitride epitaxial material;

a III-nitride gate structure coupled to the one or more channel sidewalls;

a gate metal structure in electrical contact with the III-nitride gate structure; and a dielectric layer overlying at least a portion of the gate metal structure, wherein a top surface of the dielectric layer is substantially co-planar with a top surface of the source region.

2. The semiconductor device of claim 1 further comprising a pad metal structure coupled to the top surface of the dielectric layer and electrically coupled to the second III-nitride epitaxial material.

3. The semiconductor device of claim 2 wherein the source region is characterized by a peripheral dimension defining a top surface area and the pad metal structure is in electrical contact with the top surface area.

4. The semiconductor device of claim 1 wherein the channel structure comprises a first portion having a first lateral width and a second portion having a second lateral width less than the first lateral width.

5. The semiconductor device of claim 4 wherein the gate metal structure is laterally self-aligned with respect to the second portion.

6. The semiconductor device of claim 1 wherein:
the III-nitride substrate, the first III-nitride epitaxial material, and the second III-nitride epitaxial material are of a first conductivity type; and
the III-nitride gate structure is of a second conductivity type.

7. The semiconductor device of claim 1 wherein:
the semiconductor device comprises a vertical JFET; and
the III-nitride substrate comprises a drain of the vertical JFET.

* * * * *